(12) United States Patent
Beck et al.

(10) Patent No.: US 6,563,348 B1
(45) Date of Patent: May 13, 2003

(54) METHOD AND APPARATUS FOR DOUBLE-SAMPLING A SIGNAL

(75) Inventors: Douglas R. Beck, Seattle, WA (US); David J. Allstot, Seattle, WA (US)

(73) Assignee: University of Washington, Seattle, WA (US)

( * ) Notice: Subject to any disclaimer, the term of this patent is extended or adjusted under 35 U.S.C. 154(b) by 0 days.

(21) Appl. No.: 10/095,902

(22) Filed: Mar. 11, 2002

(51) Int. Cl.⁷ ................................................ A03K 5/00
(52) U.S. Cl. .............................................. 327/94; 330/9
(58) Field of Search ........................... 327/90, 94, 560, 327/554; 330/261, 9

(56) References Cited

U.S. PATENT DOCUMENTS 4,460,874 A * 7/1984 Haque ........................ 330/261
5,248,974 A * 9/1993 Fattaruso et al. ........... 341/172

* cited by examiner

Primary Examiner—Dinh T. Le
(74) Attorney, Agent, or Firm—Blakely Sokoloff Taylor & Zafman LLC

(57) ABSTRACT

Methods and apparatuses for double-sampling a signal using an operational amplifier having dedicated unswitched connections to sample and hold circuits. In one embodiment, a circuit according to the teachings of the present invention includes an op-amp having four input terminals. Two of the input terminals are tied to ground and the other two terminals are coupled to S/H circuits through unswitched connections. In one embodiment, the S/H circuits are coupled to sample an input signal during different clock phases.

27 Claims, 3 Drawing Sheets

METHOD AND APPARATUS FOR DOUBLE-SAMPLING A SIGNAL

BACKGROUND OF THE INVENTION

1. Field of the Invention

The present invention relates generally to electronic circuits and, more specifically, the present invention relates to sampling signals with electronic circuits.

2. Background Information

In the electronic circuit industry, there is a continuing effort to increase circuit speeds as well as decrease circuit device sizes. As circuit designs become more advanced, circuits become faster, smaller and are able to operate with less voltage and power. In switched-capacitor circuitry, there is technique known as double-sampling, which enables faster analog-to-digital conversion.

To illustrate, FIG. 1 is circuit 101 illustrating double-sampling using switched-capacitor circuitry. As shown, circuit 101 includes an operational amplifier (op-amp) 103 having a non-inverting input coupled to ground and an inverting input coupled to sample and hold (S/H) circuit 105 and S/H circuit 107. S/H circuits 105 and 107 are a type of switched-capacitor circuit and are coupled to alternatingly sample an input signal vin during opposite phases of a clock signal. As shown, S/H circuit 105 is coupled to the inverting input of op-amp 103 through switch 123. S/H circuit 107 is also coupled to the same inverting input of op-amp 103 through switch 137.

In operation, switch 123 is closed while switch 137 is opened, and switch 137 is closed while switch 123 is opened. During normal operation, switches 123 and 137 are never both closed or opened simultaneously. When input signal vin is being sampled by S/H circuit 105, switches 117, 119 and 121 are closed and switches 123, 125, 127 and 129 are opened so that the input signal vin is sampled onto capacitors 111 and 109. When S/H circuit 105 is evaluated by op-amp 103, switches 117, 119, 121 and 129 are opened and switches 123, 125 and 127 are closed so that the voltage stored on capacitor 111 is evaluated by op-amp 103 through the switched connection provided by switch 123 and capacitor 109 provides a feedback capacitor coupled to the output of op-amp 103.

Similarly, when input signal vin is being sampled by S/H circuit 107, switches 131, 133 and 135 are closed and switches 137, 139, 141 and 143 are opened so that the input signal vin is sampled onto capacitors 113 and 115. When S/H circuit 107 is evaluated by op-amp 103, switches 131, 133, 135 and 143 are opened and switches 137, 139 and 141 are closed so that the voltage stored on capacitor 115 is evaluated by op-amp 103 through the switched connection provided by switch 137 and capacitor 113 provides a feedback capacitor coupled to the output of op-amp 103.

The idea behind double-sampling is that in an analog switched-capacitor system, twice the amount of data can be processed if two sets of analog sampling circuitry are interleaved. Known double-sampling approaches are based upon the ability to switch in and out two identical sampling stages, such as S/H circuits 105 and 107 through switches 123 and 137, respectively. The switching action of switches 123 and 137 reduces the overall performance of circuit 101 and as technology improves and supply voltages are scaled down, double-sampling is virtually unusable in low-voltage or low gain designs.

Known problems with circuit 101 include the fact that the inverting input of op-amp 103 is never discharged between evaluations of S/H circuits 105 and 107. Consequently, residual charge from a previous evaluation is left on the inverting input of op-amp 103 to taint or contaminate a subsequent evaluation. Another problem that limits the performance of circuit 101 is that the capacitive loads of S/H circuits 105 and 107 are both tied to the inverting input of op-amp 103. In particular, it is appreciated that even though switches 123 and 137 are never both closed simultaneously during normal operation, the capacitive loads of S/H circuits 105 and 107 are nevertheless both capacitively coupled to the inverting input of op-amp 103 since switches 123 and 137 are implemented with transistors. As a result, the maximum switching speeds of circuit 101 are reduced due to the relatively large capacitive load coupled to the inverting input of op-amp 103

SUMMARY OF THE INVENTION

Methods and apparatuses for a double-sampling a signal are disclosed. In one embodiment, a circuit according to the teachings of the present invention includes an op-amp having four input terminals. Two of the input terminals are tied to ground and the other two terminals are coupled to S/H circuits through unswitched connections. The S/H circuits are coupled to sample an input signal. Since the connections to the S/H circuits are not switched, the problems associated with having to switch in and out the S/H circuits that plague the prior art double-sampling techniques are reduced. Additional features and benefits of the present invention will become apparent from the detailed description and figures set forth below.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified. It is noted that circuit schematic embodiments are illustrated herein for explanation purposes using a single-ended topology for simplicity and discussion. In other embodiments, it is appreciated that differential circuit topologies of switched-capacitor sampling circuitry may be utilized in accordance with the teachings of the present invention.

DETAILED DESCRIPTION

Methods and apparatuses for double-sampling a signal are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

As an overview of the various embodiments of the present invention, an operational amplifier (op-amp) having a plurality of dedicated or unswitched connections to corresponding sample and hold (S/H) circuits, such as switched-capacitor circuits, is disclosed. Accordingly, it is not necessary for the S/H circuits to be switched in and out when evaluated by the op-amp for double-sampling. In addition, the unswitched connection of a S/H circuit that is not being evaluated by the op-amp is discharged to ground to reduce the change of incorrect readings during subsequent evaluations due to residual charge leftover on an input terminal of the op-amp from a previous evaluation.

Figure 1:
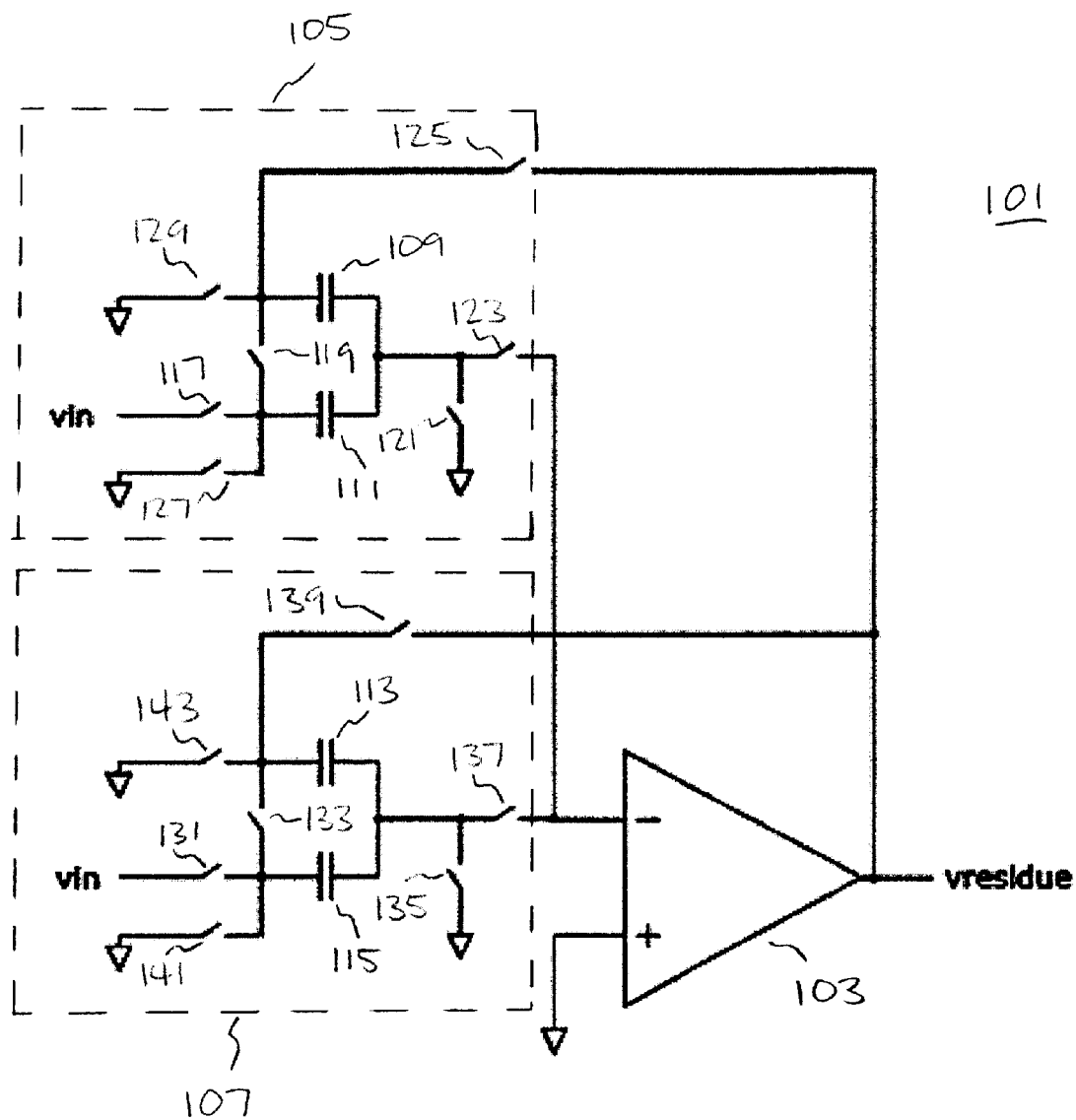
FIG. 1 is a schematic of a prior art double-sampling circuit.
Figure 2:
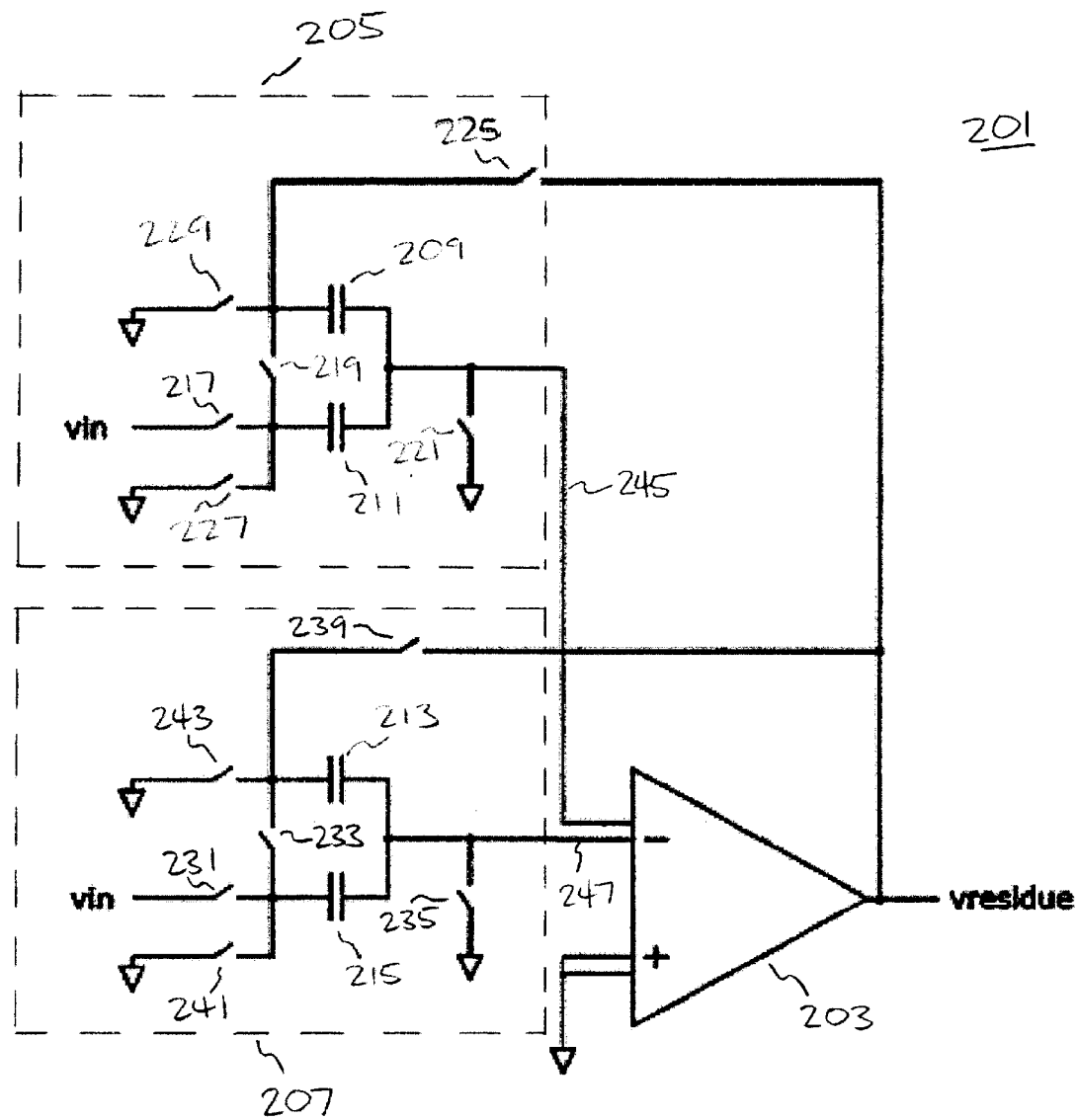
FIG. 2 is a schematic of one embodiment of a double-sampling circuit in accordance with the teachings of the present invention.
Figure 2:
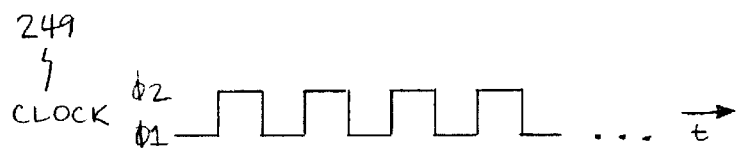

FIG. 2 is a schematic that shows generally one embodiment of a circuit 201 that provides double-sampling of an input signal in accordance with the teachings of the present invention. As summarized previously, it is noted that circuit schematic embodiments are illustrated in this description using a single-ended topology for simplicity, discussion and explanation purposes. As can be appreciated to persons having ordinary skill in the art having the benefit of this disclosure, other suitable embodiments such as differential circuit topologies may also utilized for switched-capacitor sampling circuitry in accordance with the teachings of the present invention. As shown, circuit 201 includes an op-amp 203 having a plurality of non-inverting inputs coupled to ground and a plurality of inverting inputs coupled to respective S/H circuits. In the depicted embodiment, op-amp 203 includes two non-inverting inputs coupled to ground and two inverting inputs. One of the inverting inputs of op-amp 203 is coupled to S/H circuit 205 through an unswitched connection 245 and the other of the inverting inputs of op-amp 203 is coupled to S/H circuit 207 through an unswitched connection 247. As will be discussed in greater detail below, it is appreciated that each input of op-amp 203 that is coupled to a S/H circuit is a dedicated unswitched connection and therefore does not switch between different S/H circuits.

In one embodiment, S/H circuits 205 and 207 are switched-capacitor circuits that are coupled to sample an input signal vin in accordance with the teachings of the present invention. In one embodiment, S/H circuits 205 and 207 are used for double-sampling of input signal vin and therefore sample input signal vin during different phases of a clock 249. One example of clock 249 is illustrated in FIG. 2 as a signal that that oscillates between two phases, phases φ1 and φ2 over time. In one embodiment, S/H circuits 205 and 207 are coupled to alternatingly sample an input signal vin during different phases (e.g. phases φ1 and φ2)of clock 249.

In operation, when input signal vin is being sampled by S/H circuit 205, switches 217, 219 and 221 are closed and switches 225, 227 and 229 are opened so that the input signal vin is sampled onto capacitors 209 and 211. In one embodiment, well-known transistor technology may be utilized to implement all of the switches shown in FIG. 2. For example, the switches used in FIG. 2 may utilized metal oxide semiconductor field effect transistors (MOSFETs), bipolar junction transistor (BJTs) or the like. It is appreciated that when input signal vin is being sampled by S/H circuit 205, switch 221 being closed discharges unswitched connection 245 to ground. Accordingly, the corresponding input terminal of op-amp 203 is discharged between evaluations in accordance with the teachings of the present invention. When S/H circuit 205 is evaluated by op-amp 203, switches 217, 219, 221, 229 are opened, and switches 225 and 227 are closed. The voltage stored on capacitor 211 from the previous clock phase is evaluated by op-amp 203 through unswitched connection 245 and capacitor 209 provides a feedback capacitor coupled to the output of op-amp 203.

Similarly, when input signal vin is being sampled by S/H circuit 207, switches 231, 233 and 235 are closed and switches 239, 241 and 243 are opened so that the input signal vin is sampled onto capacitors 213 and 215. It is appreciated that when input signal vin is being sampled by S/H circuit 207, switch 235 being closed discharges unswitched connection 247 to ground. Accordingly, the corresponding input terminal of op-amp 203 is discharged between evaluations in accordance with the teachings of the present invention. When S/H circuit 207 is evaluated by op-amp 203, switches 231, 233, 235 and 243 are opened and switches 239 and 241 are closed. The voltage stored on capacitor 215 from the previous clock phase is evaluated by op-amp 203 through unswitched connection 247 and capacitor 213 provides a feedback capacitor coupled to the output of op-amp 203.

As shown in FIG. 2, the capacitive loads of S/H circuits 205 and 207 are distributed across the plurality of input terminals of op-amp 203 to which each S/H circuit 205 and 207 is coupled. This distinguishes circuit 201 from known double-sampling techniques since the capacitive loads of S/H circuits 203 and 205 are not all capacitively coupled to the same input terminal of op-amp 203. Thus, the maximum switching or sampling speed of circuit 201 is not as hampered by capacitive loading of the input terminals of op-amp 203 as it would be if both capacitive loads of S/H circuits 203 and 205 were capacitively coupled to the same input terminal of op-amp 203 through switching elements.

In one embodiment, the input signal vin is the same input signal that is alternatingly sampled between S/H circuits 205 and 207 according to different phases of clock 249. This sampling technique enables high resolution sampling of input signals such as communications signals, analog signals or the like. In another embodiment, it is appreciated that the input signal vin that is sampled with S/H circuit 205 is a different signal than the input signal vin that is sampled with S/H circuit 207. In this embodiment, both input signals are alternatingly sampled with circuit 201 according to different phases of clock 249. It is appreciated that this sampling technique is useful for real time sampling of two separate signals during different phases of a real time clock signal. Such applications might include the sampling of a plurality of simultaneous communications signals, such as for example in-phase communications signals and quadrature communications signals, or other analog signals or the like.

Figure 3:
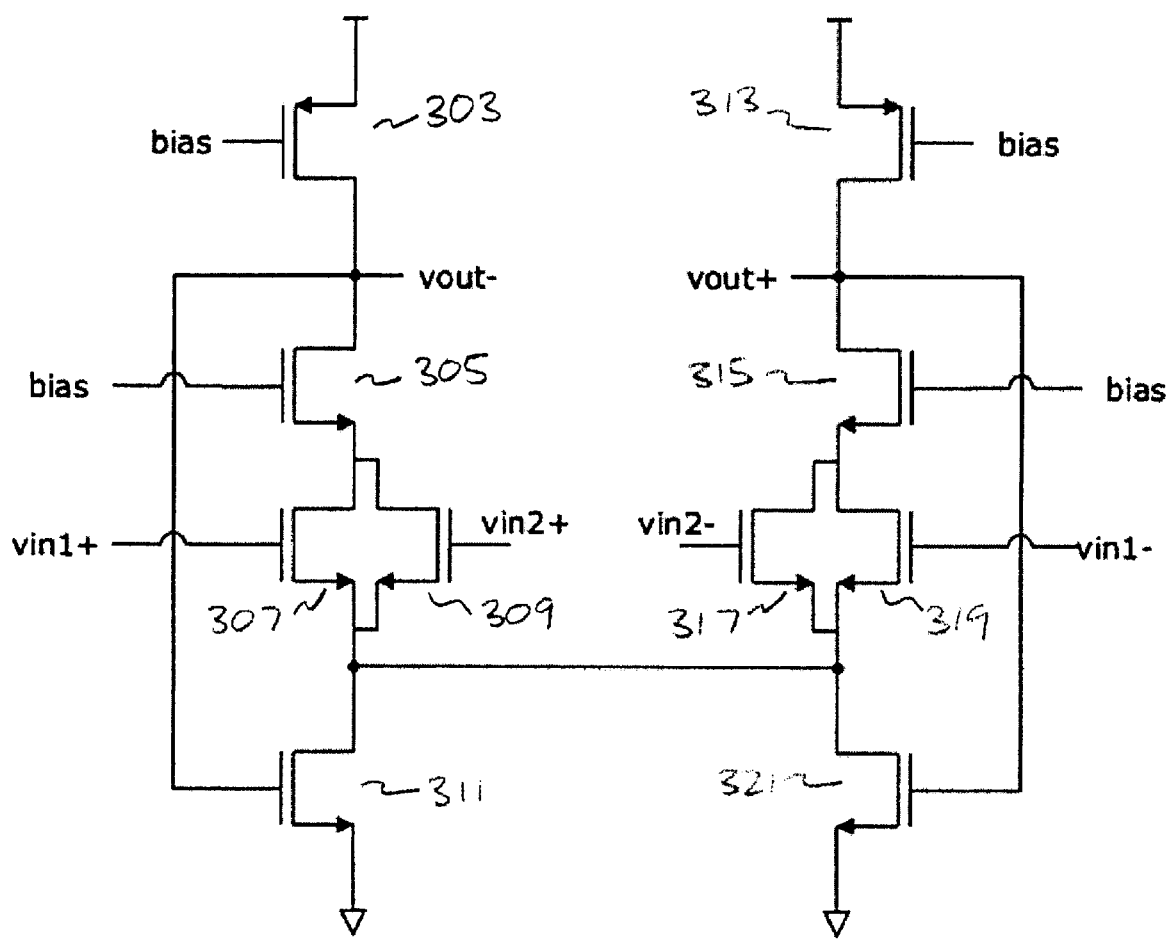
FIG. 3 is a schematic of one embodiment of an op-amp in accordance with the teachings of the present invention.

FIG. 3 is a schematic illustrating generally one embodiment of an op-amp 301 in accordance with the teachings of the present invention. In one embodiment, the circuitry of op-amp 301 may be used for op-amp 203 of FIG. 2. In the depicted embodiment, op-amp 301 includes load circuitry, which includes load transistors 303 and 313 coupled in parallel to a power or voltage supply. In one embodiment, transistors 303 and 313 have their gates or control terminals biased such that transistors 303 and 313 provide high impedance active loads to op-amp 301. In one embodiment, op-amp 301 also includes isolation circuitry, which includes isolation transistors 305 and 315 coupled to transistors 303 and 313, respectively. It is noted that the transistors illustrated and described in FIG. 3 are shown as MOSFETs for explanation purposes. It is appreciated, however, that other well-known circuit technologies may be utilized to implement op-amp 301, such as for example BJTs, resistors or the like.

Op-amp 301 also includes a plurality of input transistors, shown in FIG. 3 as transistors 307 and 309 coupled in parallel to transistor 305, and transistors 317 and 319 coupled in parallel to transistor 315. In one embodiment, the gate or control terminals of input transistors 307, 309, 317 and 319 are the inputs of op-amp 301, which are illustrated in FIG. 3 for example purposes as vin1+, vin2+, vin2− and vin1−. In an embodiment similar to that illustrated in FIG. 2, two of the op-amp 301 inputs are coupled to ground, one of the inputs is coupled to one S/H circuit through an unswitched connection, and the other input is coupled to another S/H circuit through another unswitched connection during normal operation.

In one embodiment, isolation transistors 305 and 315 have their gates or control terminals biased such that transistors 305 and 315 provide high impedance to help isolate input transistors 307, 309, 317 and 319 from load transistors 303 and 313. In so doing, the effects of voltage drops across the load circuitry on input transistors 307, 309, 317 and 319 are attenuated to values below the resolution of the op-amp 301. An example situation of the usefulness of isolation provided with transistors 305 and 315 can be demonstrated with the effects of the parasitic capacitances of input transistors 307, 309, 317 and 319 between the respective gate or control terminals and drain terminals. By reducing or attenuating the effects of voltages across load transistors 303 and 313 with isolation transistors 305 and 315, respectively, the voltage differences between the gate and drain terminals of input transistors 307, 309, 317 and 319 are reduced to an amount to where the parasitic capacitances of the input transistors is substantially insignificant.

In the depicted embodiment, op-amp 301 also includes a current source coupled between the input transistors 307, 309, 317 and 319 and ground. As shown, one embodiment of the current source includes transistors 311 and 321 coupled in parallel to ground. In one embodiment, transistor 311 is coupled between ground and input transistors 307, 309, 317 and 319 and transistor 321 is coupled between ground and input transistors 307, 309, 317 and 319. The gate or control terminal of transistor 311 is coupled to one differential output of op-amp 301 and the gate or control terminal of transistor 321 is coupled to another differential output of op-amp 301. In the depicted embodiment, the differential outputs of op-amp 301 are shown as vout− and vout+. Vout− is the electrical terminal between the drains of transistors 303 and 305 and vout+ is the electrical terminal between the drains of transistors 313 and 315. In one embodiment, it is appreciated that the output of op-amp 203, which is illustrated in FIG. 2 as vresidue, may be derived from vout− and vout+ of FIG. 3 according to the relationship vresidue= vout+−vout−.

In operation, the outputs vout− and vout+ ideally move together such that the total sum of the current flowing through both load transistors 303 and 313 remains substantially unchanged, regardless of the values at inputs vin1+, vin2+, vin2− and vin1−. In one embodiment, the utilization of the current source including transistors 311 and 321 provide op-amp 301 with an improved common mode rejection ratio. In operation, the coupling of the control terminals of transistors 311 and 321 to the loads or outputs of op-amp 301 provide continuous time common mode feedback such that as one of the transistors 311 and 321 conducts less current, the other transistor conducts more and vice versa. In addition, if the voltage drops across both load transistors 303 tend to reduce together, the transistors 311 and 321 both tend to draw more current to compensate and vice versa such that the total sum of the current flowing through both load transistors 303 and 313 tends to remains substantially unchanged.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A circuit, comprising:
   an operational amplifier (op-amp) having first, second, third and fourth input terminals, the third and fourth input terminals of the op-amp coupled to a first potential; and
   first and second sample and hold (S/H) circuits coupled to receive and sample an input signal, the first and second S/H circuits each having an output terminal coupled to the first and second input terminals, respectively, of the op-amp, the op-amp coupled to alternatingly evaluate the sampled input signals through unswitched connections between the first and second S/H circuits and the op-amp, the first S/H circuit coupled to sample the input signal while the second S/H circuit is evaluated by the op-amp, the second S/H circuit coupled to sample the input signal while the first S/H circuit is evaluated by the op-amp.

2. The circuit of claim 1 wherein the first input terminal of the op-amp and the output terminal of the first S/H circuit are discharged to the first potential while the output terminal of the second S/H circuit is evaluated by the op-amp.

3. The circuit of claim 1 wherein the second input terminal of the op-amp and the output terminal of the second S/H circuit are discharged to the first potential while the output terminal of the first S/H circuit is evaluated by the op-amp.

4. The circuit of claim 1 wherein the first potential is ground.

5. The circuit of claim 1 wherein the signal sampled by the first S/H circuit is a different signal than the signal sampled by the second S/H circuit.

6. The circuit of claim 1 wherein the first and second S/H circuits comprise first and second switched capacitor circuits, respectively.

7. The circuit of claim 1 wherein the first, second, third and fourth terminals are separate electrical terminals.

8. The circuit of claim 1 wherein a total capacitive load of the first and second S/H circuits is distributed between the first and second input terminals.

9. The circuit of claim 1 wherein the op-amp comprises:
   a current source coupled to the first potential;
   first and second loads coupled to a second potential;
   first and second input transistors coupled in parallel between the first load and the current source; and
   third and fourth input transistors coupled in parallel between the second load and the current source, the first, second, third and fourth input terminals distributed among control terminals of the first, second, third and fourth input transistors.

10. The circuit of claim 9 wherein the op-amp further comprises:
    a first attenuation circuit coupled between the first load and the first and second input transistors; and a second attenuation circuit coupled between the second load and the third and fourth input transistors.

11. The circuit of claim 9 wherein the current source comprises:
a fifth transistor coupled between the first potential and the first, second, third and fourth transistors, the fifth transistor having a control terminal coupled to the first load; and
a sixth transistor coupled between the first potential and the first, second, third and fourth transistors, the sixth transistor having a control terminal coupled to the second load.

12. The circuit of claim 9 wherein the first load comprises a seventh transistor coupled to the first potential and the second load comprises an eighth transistor coupled to the first potential.

13. The circuit of claim 10 wherein the first attenuation circuit comprises a ninth transistor coupled between the first load and the first and second input transistors and the second attenuation circuit comprises a tenth transistor coupled between the second load and the third and fourth input transistors.

14. A method, comprising:
sampling a signal with a first sample and hold (S/H) circuit during a first phase of an oscillating clock signal;
evaluating the first S/H circuit through a first unswitched connection between the first S/H circuit and a first input terminal of an operational amplifier (op-amp) during a second phase of the oscillating clock signal;
sampling the signal with a second S/H circuit during the second phase of the oscillating clock signal;
evaluating the second S/H circuit through a second unswitched connection between the second S/H circuit and a second input terminal of the op-amp during the first phase of the oscillating clock signal;
discharging the first unswitched connection to ground during the second phase of the oscillating clock signal; and
discharging the second unswitched connection to ground during the first of the oscillating clock signal.

15. The method of claim 14 further comprising coupling third and fourth input terminals of the op-amp to ground.

16. The method of claim 14 further comprising:
coupling first and second loads of the op-amp in parallel to power;
coupling first and second input transistors of the op-amp in parallel to the first load;
coupling third and fourth input transistors of the op-amp in parallel to the second load; and
sinking current flowing through the first, second, third and fourth input transistors of the op-amp.

17. The method of claim 16 wherein sinking the current flowing through the first, second, third and fourth input transistors of the op-amp comprises sinking the current with a current source having fifth and sixth transistors coupled to ground.

18. The method of claim 17 further comprising:
controlling the fifth transistor of the current source with a voltage drop across the first load; and
controlling the sixth transistor of the current source with a voltage drop across the second load.

19. The method of claim 16 further comprising attenuating effects on the first and second transistors from the first load with a seventh transistor coupled between the first load and the first and second transistors.

20. The method of claim 16 further comprising attenuating effects on the third and fourth transistors from the second load with a eighth transistor coupled between the second load and the third and fourth transistors.

21. The method of claim 14 further comprising distributing a total capacitive load of the first and second S/H circuit across the first and second input terminals of the op-amp.

22. A circuit, comprising:
a first switched capacitor circuit coupled to sample an input signal during a first phase of an oscillating clock signal;
a second switched capacitor circuit coupled to sample the input signal during a second phase of the oscillating clock signal; and
an operational amplifier (op-amp) having a first input coupled to the first switched capacitor circuit through a first unswitched connection between the op-amp and the first switched capacitor circuit, the op-amp further having a second input coupled to the second switched capacitor circuit through a second unswitched connection between the op-amp and the second switched capacitor circuit, the op-amp coupled to the evaluate the first switched capacitor circuit during the second phase of the oscillating clock signal, the op-amp coupled to the evaluate the second switched capacitor circuit during the first phase of the oscillating clock signal.

23. The circuit of claim 22 wherein the first unswitched connection between the op-amp and the first switched capacitor circuit is coupled to be discharged to ground during the first phase of an oscillating clock signal.

24. The circuit of claim 22 wherein the second unswitched connection between the op-amp and the second switched capacitor circuit is coupled to be discharged to ground during the second phase of an oscillating clock signal.

25. The circuit of 22 wherein the op-amp comprises a plurality of input transistors, the plurality of transistors including a first input transistor having a control terminal coupled to the first unswitched connection between the op-amp and the first switched capacitor circuit, the plurality of transistors including a second input transistor having a control terminal coupled to the second unswitched connection between the op-amp and the second switched capacitor circuit.

26. The circuit of claim 25 wherein in the op-amp further comprises isolation circuitry coupled between load circuitry of the op-amp and the plurality of input transistors, the load circuitry coupled to attenuate effects of voltage drops across the load circuitry on the plurality of input transistors to values below a resolution of the op-amp.

27. The circuit of claim 25 wherein the op-amp further comprises a current source coupled to sink current flowing through the op-amp, the current source including a plurality of current source transistors having control terminals coupled to the load circuitry.

* * * * *